(12) United States Patent
Liu et al.

(10) Patent No.: US 11,469,346 B2
(45) Date of Patent: Oct. 11, 2022

(54) LIGHT-EMITTING DEVICE

(71) Applicant: HKC Corporation Limited, Shenzhen (CN)

(72) Inventors: Zhen Liu, Shenzhen (CN); En-Tsung Cho, Shenzhen (CN)

(73) Assignee: HKC CORPORATION LIMITED, Shenzhen (CN)

( * ) Notice: Subject to any disclaimer, the term of this patent is extended or adjusted under 35 U.S.C. 154(b) by 270 days.

(21) Appl. No.: 17/043,502

(22) PCT Filed: Dec. 11, 2018

(86) PCT No.: PCT/CN2018/120286
§ 371 (c)(1),
(2) Date: Sep. 29, 2020

(87) PCT Pub. No.: WO2020/113618
PCT Pub. Date: Jun. 11, 2020

(65) Prior Publication Data
US 2021/0111305 A1    Apr. 15, 2021

(30) Foreign Application Priority Data
Dec. 4, 2018  (CN) .......................... 201811474938.1

(51) Int. Cl.
*H01L 51/50* (2006.01)
*H01L 33/06* (2010.01)
*H01L 33/14* (2010.01)

(52) U.S. Cl.
CPC .............. *H01L 33/06* (2013.01); *H01L 33/14* (2013.01); *H01L 51/502* (2013.01);
(Continued)

(58) Field of Classification Search
CPC . H01L 51/502; H01L 51/504; H01L 51/5012; H01L 51/5056; H01L 51/5072;
(Continued)

(56) References Cited

U.S. PATENT DOCUMENTS 10,217,953 B2 *  2/2019  He ..................... H01L 51/56
10,497,890 B2 * 12/2019  He ..................... H01L 51/502
(Continued)

FOREIGN PATENT DOCUMENTS

CN      105870347 A     8/2016
CN      106229423 A    12/2016
(Continued)

OTHER PUBLICATIONS

Chinese Office Action, dated Jul. 31, 2019, in corresponding Chinese Patent Application No. 201811474938.1, 7 pages.
(Continued)

*Primary Examiner* — Savitri Mulpuri
(74) *Attorney, Agent, or Firm* — Hauptman Ham, LLP

(57) ABSTRACT

The present application relates to a light-emitting device, comprising an anode, a hole injection layer, a hole transport layer, a light-emitting layer, an electron transport layer, an electron injection layer, and a cathode, which are stacked in sequence, wherein the light-emitting layer comprises N stacked light-emitting units; each light-emitting unit comprises a thermal activation delayed fluorescent material layer and a quantum dot material layer; the light emitted from the thermal activation delayed fluorescent material layer and the light emitted from the quantum dot material layer are synthesized into white light.

20 Claims, 3 Drawing Sheets

(52) U.S. Cl.
CPC ........ *H01L 51/504* (2013.01); *H01L 51/5012* (2013.01); *H01L 51/5036* (2013.01)

(58) Field of Classification Search
CPC .. H01L 51/5037; H01L 33/06; H01L 51/5088
See application file for complete search history.

(56) References Cited

U.S. PATENT DOCUMENTS

| | | | |
|---|---|---|---|
| 10,797,112 B2* | 10/2020 | Hack | H01L 51/5262 |
| 2017/0186986 A1 | 6/2017 | Lee et al. | |
| 2019/0115555 A1* | 4/2019 | He | H01L 51/5036 |
| 2020/0028090 A1* | 1/2020 | Zhang | H01L 51/0072 |
| 2021/0139445 A1* | 5/2021 | Takeda | H01L 51/0061 |
| 2021/0155849 A1* | 5/2021 | Stubbs | C09K 11/0883 |

FOREIGN PATENT DOCUMENTS

| | | | | |
|---|---|---|---|---|
| CN | 106848080 | * | 6/2017 | ........... H01L 51/502 |
| CN | 106997926 A | | 8/2017 | |
| CN | 107017325 A | | 8/2017 | |
| CN | 107123725 A | | 9/2017 | |
| CN | 107808931 A | | 3/2018 | |
| CN | 108039417 A | | 5/2018 | |

OTHER PUBLICATIONS

Chinese Office Action, dated Jan. 15, 2020, in corresponding Chinese Patent Application No. 201811474938.1, 5 pages.
International Search Report and Written Opinion, dated Aug. 19, 2019, in corresponding International Patent Application No. PCT/CN2018/120286, 5 pages.

* cited by examiner

LIGHT-EMITTING DEVICE

CROSS REFERENCE TO RELATED APPLICATIONS

This application claims priority to Chinese Patent Application No. 201811474938.1, filed with the Chinese Patent Office on Dec. 4, 2018 and entitled "LIGHT-EMITTING DEVICE", which is incorporated herein by reference in its entirety.

TECHNICAL FIELD

The present application relates to the field of display, and more particularly, to a light emitting device.

BACKGROUND

Quantum Dot is a quasi-zero-dimensional nano-material with significant quantum size effect. The luminescence spectrum of quantum dots can be controlled by changing the size of quantum dots. Therefore, quantum dot materials are widely used in the display field. At present, a quantum dot light emitting device that emits white light mainly uses a stack of quantum dot light emitting layers, and white light is obtained by color mixing, such as a quantum dot light emitting layer stack that respectively emits red light, green light, and blue light to generate white light. The use of quantum dot luminescent material stacks can produce white light, but quantum dot materials have the problem of low emitting efficiency.

SUMMARY

A light emitting device is provided in accordance with various embodiments of the present application.

A light emitting device is provided, including:
an anode;
a hole injection layer formed on the anode;
a hole transport layer formed on the hole injection layer;
a light emitting layer formed on the hole transport layer;
an electron transport layer formed on the light emitting layer;
an electron injection layer formed on the electron transport layer; and
a cathode formed on the electron injecting layer,
wherein the light emitting layer includes N stacked light emitting units, each of the light emitting units includes a thermally activated delayed fluorescence material layer and a quantum dot material layer, light emitted by the thermally activated delayed fluorescence material layer and light emitted by the quantum dot material layer are combined into white light, and $N \geq 1$.

In the above light emitting device, the light emitting layer includes a plurality of light emitting units, each of the light emitting units includes a multi-layer structure including a thermally activated delayed fluorescence material layer and a quantum dot material layer, and the light emitted by the thermally activated delayed fluorescence material layer and the light emitted by the quantum dot material layer combined into white light so that the light emitting device emits white light. Since the emitting efficiency of the thermally activated delayed fluorescence material is relatively high, and the thermally activated delayed fluorescence material not only emits light by itself, but also transfers energy to the quantum dot material layer to excite the quantum dot material to emit light, thereby improving the emitting efficiency of the light emitting device.

In one embodiment, the thermally activated delayed fluorescence material layer includes a thermally activated delayed fluorescence material emitting blue light, the quantum dot material layer comprising a first quantum dot material layer emitting yellow light, and the first quantum dot material layer is formed on the thermally activated delayed fluorescence material layer of an associated light emitting unit.

In one embodiment, the thermally activated delayed fluorescence material layer has a thickness ranging from 10 nm to 60 nm.

In one embodiment, the first quantum dot material layer has a thickness ranging from 50 nm to 250 nm.

In one embodiment, the first quantum dot material layer is formed on a side of the thermally activated delayed fluorescence material layer of an associated light emitting unit that faces away from the hole transport layer.

In one embodiment, an absolute value of a highest occupied molecular orbital energy level of the thermally activated delayed fluorescence material is greater than an absolute value of a valence band top level of the quantum dot material.

In one embodiment, an absolute value of a lowest unoccupied molecular orbital energy level of the thermally activated delayed fluorescence material is greater than an absolute value of a conduction band bottom level of the quantum dot material.

In one embodiment, the light emitting unit further includes a second quantum dot material layer that emits green light.

In one embodiment, the second quantum dot material layer is formed on a side of the thermally activated delayed fluorescence material layer in the associated light emitting unit that faces away from the first quantum dot material layer.

In one embodiment, the second quantum dot material layer is formed on a side of the first quantum dot material layer in the associated light emitting unit that faces away from the thermally activated delayed fluorescence material layer.

In one embodiment, the hole transport layer includes a first silica mesoporous frame and a hole transport material housed within the first silica mesoporous frame.

In one embodiment, regularly arranged mesopores are formed in the silica mesoporous frame, and the mesopores have a pore diameter ranging from 2 nm to 50 nm.

In one embodiment, the hole transport material includes an aromatic tertiary amine.

In one embodiment, the electron transport layer includes a second silica mesoporous frame and an electron transport material housed within the second silica mesoporous frame.

In one embodiment, the quantum dot material layer includes a third silica mesoporous frame and a quantum dot material housed within the third silica mesoporous frame.

In one of the embodiments, the light emitting device further includes a glass substrate.

In one of the embodiments, the anode includes an indium tin oxide semiconductor thin film.

In one embodiment, the thermally activated delayed fluorescence material layer is arranged to transfer energy to the quantum dot material layer by means of a fluorescence resonance energy transfer.

A light emitting device is also provided, including:
an anode;
a hole injection layer formed on the anode;

a hole transport layer formed on the hole injection layer;

a light emitting layer formed on the hole transport layer;

an electron transport layer formed on the light emitting layer;

an electron injection layer formed on the electron transport layer; and a cathode formed on the electron injecting layer, wherein the light emitting layer includes N stacked light emitting units, N≥1, and each of the light emitting units includes:

a thermally activated delayed fluorescence material layer, including a thermally activated delayed fluorescence material that emits blue light;

a first quantum dot material layer including a quantum dot material emitting yellow light, formed on the thermally activated delayed fluorescence material layer of an associated light emitting unit; and a second quantum dot material layer, including a quantum dot material emitting green light, formed on a side of the thermally activated delayed fluorescence material layer of the associated light emitting unit that faces away from the first quantum dot material layer, an absolute value of a highest occupied molecular orbital energy level of said thermally activated delayed fluorescence material is greater than an absolute value of a valence band top level of the quantum dot material, and an absolute value of a lowest unoccupied molecular orbital energy level of the thermally activated delayed fluorescence material is greater than an absolute value of a conduction band bottom level of the quantum dot material.

In the above light emitting device, the light emitting layer includes an stacked thermally activated delayed fluorescence material layer, a first quantum dot material layer and a second quantum dot material layer, wherein the thermally activated delayed fluorescence material layer emits blue light, the first quantum dot material layer emits yellow light, and the second quantum dot material layer emits green light. The thermally activated delayed fluorescence material layer emits blue light while transferring energy to the first quantum dot material layer and the second quantum dot light emitting layer, to excite the first quantum dot material layer to emit yellow light, and excite the second quantum dot material layer to emit green light, and three light colors can be mixed to obtain a white with higher purity. At the same time, the absolute value of the highest occupied molecular orbital energy level of the thermally activated delayed fluorescence material is greater than the absolute value of the valence band top energy level of the quantum dot material, and the absolute value of the lowest unoccupied molecular orbital energy level of the thermally activated delayed fluorescence material is smaller than the absolute value of the conduction band bottom energy level of the quantum dot material, which enables the energy of the thermally activated delayed fluorescence material layer to be efficiently transmitted to the quantum dot material layer, and the quantum material layer is excited to emit light, so that the light emitting device emits light more stably.

BRIEF DESCRIPTION OF THE DRAWINGS

To better describe and illustrate the embodiments and/or examples of those applications disclosed herein, reference may be made to one or more of the drawings. The additional details or examples used to describe the drawings are not to be construed as limiting the scope of any of the disclosed application, the presently described embodiments and/or examples, and the best model for these applications which is currently understood.

DETAILED DESCRIPTION OF THE EMBODIMENTS

Figure 1:
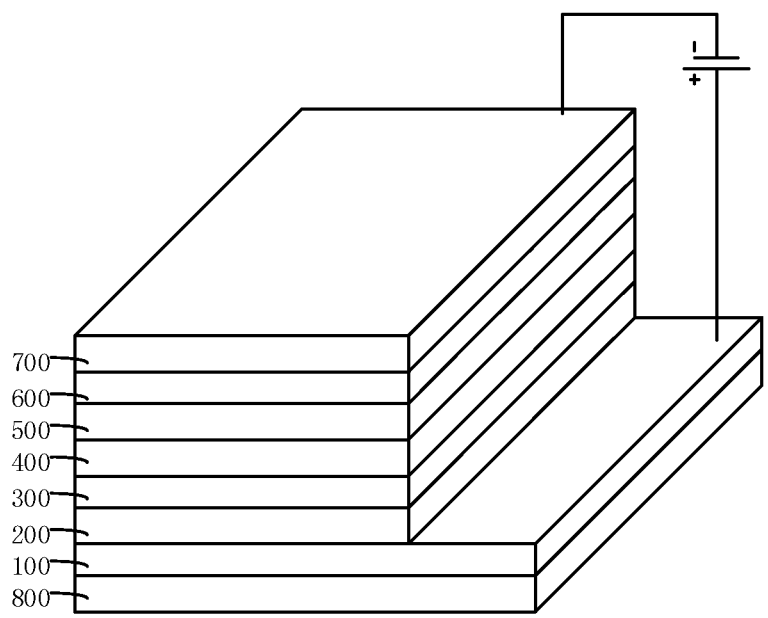
FIG. 1 is a schematic structural diagram illustrating a light emitting device according to an embodiment.

In order to facilitate the understanding of the present application, the present application will be described more fully hereinafter with reference to the accompanying drawings. Preferred embodiments of the present application are given in the drawings. However, the application can be embodied in many different forms and is not limited to the embodiments described herein. Rather, these embodiments are provided for the purpose of making the disclosure of the present application more comprehensive.

All technical and scientific terms used herein have the same meaning as commonly understood by a person skilled in the art to which this disclosure applies, unless otherwise defined. The terminology used herein is for the purpose of describing particular embodiments, and is not intended to be limiting. The term "and/or" used herein includes any and all combinations of one or more of the associated listed items.

In order to fully understand the present application, detailed steps and structures are set forth in the following description in order to explain the technical solutions set forth herein. The preferred embodiments of the present application are described in detail below, but the present application may have other embodiments in addition to the detailed description.

Figure 2:
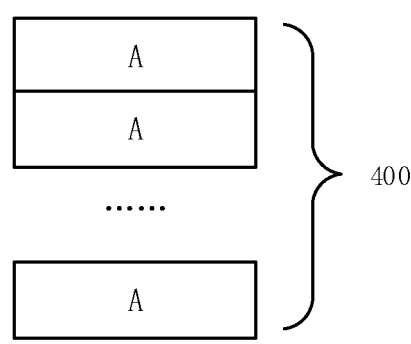
FIG. 2 is a schematic diagram illustrating a configuration of a light emitting layer according to an embodiment.

As shown in FIG. 1 and FIG. 2, in an embodiment, the light emitting device includes an anode 100, a hole injection layer 200, a hole transport layer 300, a light emitting layer 400, an electron transport layer 500, and an electron injection layer 600 and a cathode 700 sequentially stacked. The light emitting layer includes N stacked light emitting units A, each of the light emitting units A includes a thermally activated delayed fluorescence (TADF) material layer and a quantum dot material layer, light emitted by the TADF material layer and light emitted by the quantum dot material layer are combined into white light, and N≥1.

The above light emitting device may be connected to an external power source through the anode and the cathode. After the light emitting device is powered on, the cathode electron enters the light emitting layer through the electron injection layer and the electron transport layer, the anode hole enters the light emitting layer through the hole injection layer and the hole transport layer, and the electron and the holes are combined in the light emitting layer to form excitons, so that the light emitting layer is in an excited state. The process in which the light emitting layer is restored to an equilibrium state from the excited state is a process of transitioning from a high energy level to a low energy level, during which light is emitted by radiation and the color of the radiation light is determined based on a transition energy level difference. The excitons formed by the excited state of the fluorescence material contain 25% singlet excitons and 75% triplet excitons, wherein only singlet excitons can radiate fluorescence. If white light is generated only by stacked quantum dot materials, since the light emitted by the quantum dot material is fluorescence, the internal quantum efficiency of the quantum dot material does not exceed 25%, resulting in low emitting efficiency of the quantum dot luminescent material. In this embodiment, a TADF material layer is provided, and electrons and holes are combined in the TADF material layer to generate singlet excitons and triplet excitons. The singlet excitons can directly transit to emit fluorescence, while the triplet excitons cannot directly transit to radiate fluorescence, but can be converted to singlet excitons by reverse intersystem crossing (RISC) process. The converted singlet excitons can radiate fluorescence, making the quantum efficiency of TADF materials higher, which can be close to 100% in theory. At the same time, the quantum material layer is formed on the TADF material layer. The TADF material itself can not only radiate light, but also transfer exciton energy to the quantum material layer to excite the quantum material layer to emit light, and the light emitted by the quantum material layer and the light emitted by the TADF material are combined into white light. Due to the high quantum efficiency in the TADF material, the use of the TADF material layer can improve the emitting efficiency of the light emitting device as a whole. At the same time, in the quantum material layer, the excitons that excite the quantum material layer emit light from two aspects. A part of the energy is an exciton generated by the electron hole recombination transmitted to the quantum layer, and the excitons can only partially radiate fluorescence with a low emitting efficiency. The other part is to obtain singlet excitons in TADF materials and triplet excitons which can be converted into singlet excitons by reverse intersystem crossing (RISC) process, which all can radiate fluoresce and the emitting efficiency is high, and the emitting efficiency of the quantum layer can be improved by extracting exciton energy from the TADF material layer, thereby further improving the emitting efficiency of the light emitting device.

In one embodiment, as shown in FIG. 1, the light emitting device further includes a substrate 800, typically a glass substrate. At least one of two sides of the emitting layer 400 can be transparent to light. In this embodiment, the light emitting device emits light from the anode side thereof. Correspondingly, the anode is a transparent material, generally ITO (Indium Tin Oxide Semiconductor).

In one embodiment, the TADF material layer includes a TADF material emitting blue light, and the quantum dot material layer includes a first quantum dot material emitting yellow light. The first quantum dot material layer emitting yellow light is formed on the TADF material emitting blue light. Blue light combines with yellow light to produce white light. In one embodiment, the thickness of the thermally activated delayed fluorescence material layer ranges from 10 nm to 60 nm, and the thickness of the first quantum dot material layer ranges from 50 nm to 250 nm, in which stable white light can be generated and the thickness of the product can be minimized.

Figure 3:
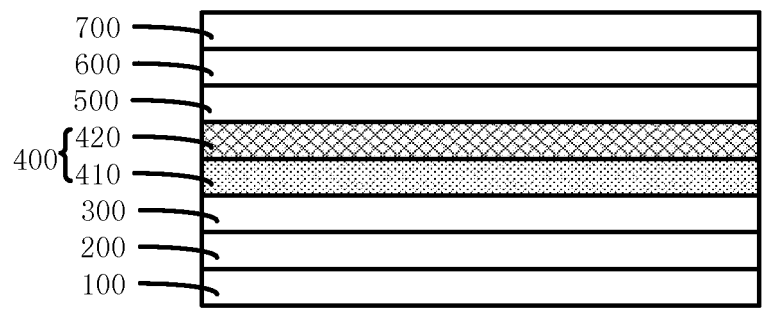
FIG. 3 is a schematic structural diagram illustrating a light emitting device according to another embodiment.

In one embodiment, the first quantum dot material layer is formed on a side of the TADF material layer that faces away from the hole transport layer, that is, the first quantum dot material layer is closer to the cathode side, while the TADF material layer is closer to the anode side. As shown in FIG. 3, when N=1, the light emitting device includes an anode 100, a hole injection layer 200, a hole transport layer 300, a TADF material layer 410 emitting blue light, a first quantum dot material layer 420 emitting yellow light, a electron transport layer 500, a electron injection layer 600, and a cathode 700 sequentially stacked, wherein the TADF material layer 410 emitting blue light and the first quantum dot material layer 420 emitting yellow light constitute the light emitting layer 400. In this embodiment, electrons enter the first quantum dot material layer 420 through the electron injection layer 600 and the electron transport layer 500, and a portion of the electrons entering the first quantum dot material layer 420 are retained in the first quantum dot material layer 420, and another portion of the electrons continue to be transported to the TADF material layer 410. Holes pass through the hole injection layer 200 and the hole transport layer 300 into the TADF material layer 410, a portion of the holes entering the TADF material layer 410 are remained in the TADF material layer 410, and the other portion of the holes continue to be transported to first quantum dot material layer 420. The electrons and holes transported into the TADF material layer 410 recombine to generate excitons that excite the TADF material to emit blue light. The excitons that cause the first quantum material layer 420 to emit light are derived from two aspects. On the one hand, the electrons and holes transported to the first quantum dot material layer 420 are recombined to generate excitons, and the first quantum dot material layer 420 is excited to emit yellow light. On the other hand, the TADF material layer 410 transfers its internal excitons to the first quantum dot material layer 420 by means of a fluorescence resonance (Forster) energy transfer method to excite the first quantum dot material to emit yellow light. It can be understood that the TADF material layer 410 transfers its internal excitons to the first quantum dot material layer 420 by means of fluorescence resonance (Forster) energy transfer, provided that the emission spectrum of the TADF material overlaps with the absorption spectrum of the first quantum dot material. The blue light emitted by the TADF material layer 410 is mixed with the yellow color emitted by the first quantum dot material layer 420 to form white light, so that the light emitting device finally emits white light. Since the holes injected from the anode are usually more than the electrons injected from the cathode, the carrier recombination region is shifted toward the cathode side. In this embodiment, by placing the TADF material layer 410 on the anode side, the TADF material can be further effectively capture electrons and attenuate the problem of recombination region offset. In other embodiments, N may be greater than 1, that is, the light emitting layer includes a plurality of light emitting units A composed of the above-described TADF material layer 410 emitting blue light and the first quantum dot material layer 420 emitting yellow light, and each of the light emitting units A are sequentially stacked to form the light emitting layer. It is assumed that the number of the light emitting units A is determined according to specific needs, and the light emitting unit is added to improve the light emitting brightness and efficiency.

Figure 4:
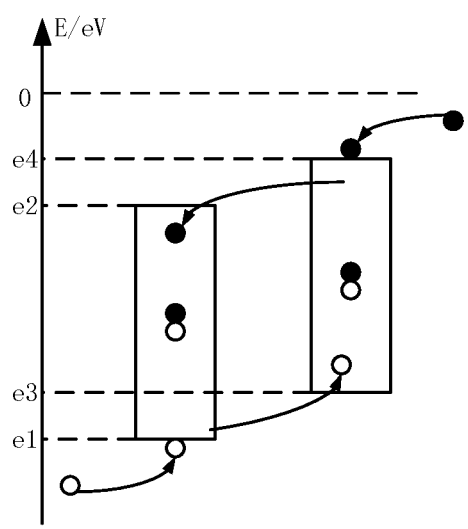
FIG. 4 is a diagram illustrating a relationship between energy levels of a TADF material and a quantum dot material according to an embodiment.

In one embodiment, a relationship between the energy level of the TADF material and the energy level of the quantum dot material is shown in FIG. 4, wherein an absolute value of a highest occupied molecular orbital (HOMO) energy level e1 of the TADF material is greater than an absolute value of a valence band top level e3 of the quantum dot material, and an absolute value of a lowest unoccupied molecular orbital (LUMO) energy level e2 of the TADF material is greater than an absolute value of a conduction band bottom level e4 of the quantum dot material. In this embodiment, the LUMO energy level of the TADF material is lower than the conduction band bottom level of the quantum dot material, which facilitates the efficient transfer of electrons (solid circles in FIG. 4) from the quantum dot material layer to the TADF material layer, and the HOMO energy level of the TADF material is lower than the conduction band bottom level of the quantum dot material, which facilitates the hole (the hollow circle in FIG. 4) to be efficiently transferred from the activated delayed fluorescence material layer to the quantum dot material layer, thereby making carrier recombination occur in both of the TADF material layer and the quantum dot material layer to cause the material of each layer to emit light. The emitted light is finally mixed to form white light. It should be noted that although the quantum dot material layer also has a recombination effect of carriers, most of the carriers flow to the TADF material layer, and the recombination effect in the TADF material layer is much larger than that in the quantum dot material layer. The exciton portion generated by the recombination in the TADF material layer is transferred to the quantum material layer again, and the efficiency of excitation by the internal carrier recombination in the quantum material layer is low. In this embodiment, the quantum dot material layer is excited to emit light by setting the TADF material layer and energy transfer method, which can greatly enhance the emitting efficiency of the light emitting device.

Figure 5A:
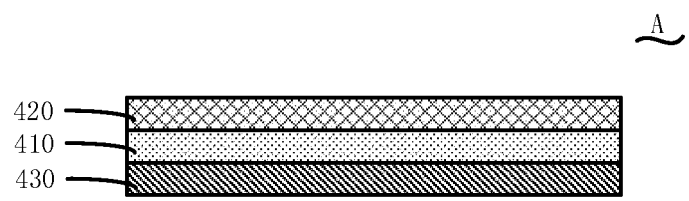
FIG. 5a is a schematic structural diagram illustrating a light emitting unit according to an embodiment.
Figure 5B:
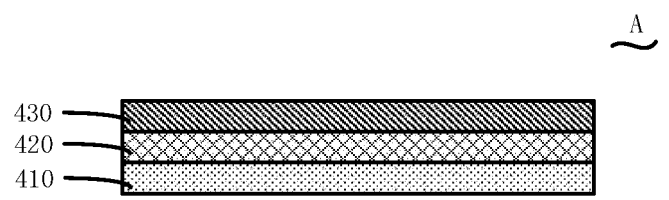
FIG. 5b is a schematic structural diagram illustrating a light emitting unit according to another embodiment.

In an embodiment, as shown in FIG. 5a, the light emitting unit A includes a second quantum dot material layer 430 emitting green light in addition to the TADF material layer 410 emitting blue light and the first quantum dot material layer 420 emitting yellow light. A second quantum dot material layer 430 is formed on a side of the TADF material layer 410 emitting blue light that faces away from the first quantum dot material layer 420, that is, the second quantum dot material layer is located on a side close to the hole output layer. In another embodiment, as shown in FIG. 5b, the second quantum dot material layer 430 emitting green light is formed on the side of the first quantum dot material layer 420 emitting yellow away from the TADF material layer 410 emitting blue light. Since the white light generated by the combination of yellow light and blue light is not high in purity, the purity of white light can be improved by adding a layer of a second quantum material emitting green light.

Figure 6:
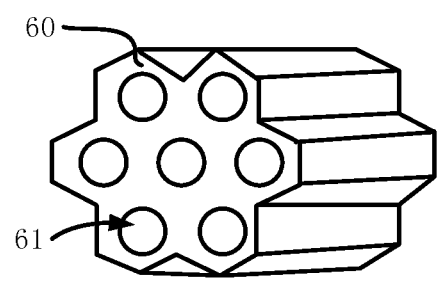
FIG. 6 is a partial schematic diagram illustrating a silica mesoporous frame according to an embodiment.

In an embodiment, the hole transport layer 300 includes a first silica mesoporous frame and a hole transport material housed within the first silica mesoporous frame. As shown in FIG. 6, regularly arranged mesopores 61 are formed in the silica mesoporous frame 60, with a pore diameter ranging from 2 nm to 50 nm. In this embodiment, a first silica mesoporous frame is formed on the hole injection layer 200, and a hole transport material is filled in the mesopores in the first silica mesoporous frame to form a hole transport layer 300. The hole transport material has strong hole transport properties, and an aromatic tertiary amine is generally used as a hole transport material. In an embodiment, the electron transport layer 500 includes a second silica mesoporous frame and an electron transport material housed within the second silica mesoporous frame, and specifically, a second silica is formed on the light emitting layer 400, and a hole transport material is filled in the mesopores in the second silica mesoporous frame to form a electron transport layer 500. In one embodiment, the quantum dot material layer includes a third silica mesoporous frame and a quantum dot material housed within the third silica mesoporous frame. The material is filled in the mesopores, on the one hand, the material distribution is uniform, on the other hand, the film layer is formed relative to the vapor deposition coating method, and a solution processing process is used to fill the material in the mesopores, thereby reducing waste and improving material utilization, which can effectively reduce costs.

The present application also discloses another light emitting device, including an anode 100, a hole injection layer 200, a hole transport layer 300, a light emitting layer 400, an electron transport layer 500, an electron injection layer 600, and a cathode 700 sequentially stacked. The light emitting layer includes N stacked light emitting units A. Each of the light emitting units A includes a TADF material layer 410 emitting blue light, a first quantum dot material layer 420 emitting a yellow light formed on the TADF material layer, and a second quantum dot material layer 430 emitting green light on a side of the TADF material layer 410 that faces away from the first quantum dot material layer 420. An absolute value of a highest occupied molecular orbital energy level of the TADF material is greater than an absolute value of a valence band bottom level of the quantum dot material, and an absolute value of a lowest unoccupied molecular orbital energy level of the thermally activated delayed fluorescence material is greater than an absolute value of a conduction band bottom level of the quantum dot material.

The light emitting device emits blue light, yellow light, and green light through the TADF material layer 410, the first quantum material layer 420, and the second quantum material layer 430, respectively, and the three colors of the light are mixed to form white light of high purity. At the same time, due to the use of the TADF material layer 410, the internal quantum efficiency of the TADF material is high, and the excitons in the TADF material layer 410 can be transferred to the quantum dot material layer to excite the quantum dot material layer to emit light, thereby greatly improving the emitting efficiency of the light emitting device. At the same time, the absolute value of the highest occupied molecular orbital energy level of the TADF material is greater than the absolute value of the valence band energy level of the quantum dot material layer. The absolute value of the lowest unoccupied molecular orbital energy level of the TADF material is greater than the absolute value of the conduction band energy of the quantum dot material layer, which is beneficial to the carrier transport, so that the carriers are fully recombined in the light emitting layer, which further improves the emitting efficiency of the light emitting device. The light emitting process of the light emitting device has been analyzed in detail above, and is no longer described here.

The technical features of the above-described embodiments may be combined in any combination. For the sake of brevity of description, all possible combinations of the technical features in the above embodiments are not described. However, as long as there is no contradiction between the combinations of these technical features, all should be considered as the scope of this specification.

The above-mentioned embodiments are merely illustrative of several embodiments of the present application, and the description thereof is more specific and detailed, but is not to be construed as limiting the scope of the claims. It should be noted that a number of variations and modifications may be made by the person skilled in the art without departing from the spirit and scope of the present application. Therefore, the scope of the disclosure should be determined by the appended claims.

What is claimed is:

1. A light emitting device, comprising:
an anode;
a hole injection layer formed on the anode;
a hole transport layer formed on the hole injection layer;
a light emitting layer formed on the hole transport layer;
an electron transport layer formed on the light emitting layer;
an electron injection layer formed on the electron transport layer; and
a cathode formed on the electron injecting layer,
wherein the light emitting layer comprises N stacked light emitting units, each of the light emitting units comprises a thermally activated delayed fluorescence material layer and a quantum dot material layer, light emitted by the thermally activated delayed fluorescence material layer and light emitted by the quantum dot material layer are combined into white light, and N≥1.

2. The light emitting device according to claim 1, wherein the thermally activated delayed fluorescence material layer comprises a thermally activated delayed fluorescence material that emits blue light, the quantum dot material layer comprises a first quantum dot material layer that emits yellow light, and the first quantum dot material layer is formed on the thermally activated delayed fluorescence material layer of an associated light emitting unit.

3. The light emitting device according to claim 2, wherein the thermally activated delayed fluorescence material layer has a thickness ranging from 10 nm to 60 nm.

4. The light emitting device according to claim 2, wherein the first quantum dot material layer has a thickness ranging from 50 nm to 250 nm.

5. The light emitting device according to claim 2, wherein the first quantum dot material layer is formed on a side of the thermally activated delayed fluorescence material layer of an associated light emitting unit that faces away from the hole transport layer.

6. The light emitting device according to claim 1, wherein an absolute value of a highest occupied molecular orbital energy level of the thermally activated delayed fluorescence material is greater than an absolute value of a valence band top level of the quantum dot material.

7. The light emitting device according to claim 1, wherein an absolute value of a lowest unoccupied molecular orbital energy level of the thermally activated delayed fluorescence material is greater than an absolute value of a conduction band bottom level of the quantum dot material.

8. The light emitting device according to claim 2, wherein the light emitting unit further comprises a second quantum dot material layer that emits green light.

9. The light emitting device according to claim 8, wherein the second quantum dot material layer is formed on a side of the thermally activated delayed fluorescence material layer in the associated light emitting unit that faces away from the first quantum dot material layer.

10. The light emitting device according to claim 8, wherein the second quantum dot material layer is formed on a side of the first quantum dot material layer in the associated light emitting unit that faces away from the thermally activated delayed fluorescence material layer.

11. The light emitting device according to claim 1, wherein the hole transport layer comprises a first silica mesoporous frame and a hole transport material housed within the first silica mesoporous frame.

12. The light emitting device according to claim 11, wherein regularly arranged mesopores are formed in the silica mesoporous frame, and the mesopores have a pore diameter ranging from 2 nm to 50 nm.

13. The light emitting device according to claim 11, wherein the hole transport material comprises an aromatic tertiary amine.

14. The light emitting device according to claim 1, wherein the electron transport layer comprises a second silica mesoporous frame and an electron transport material housed within the second silica mesoporous frame.

15. The light emitting device according to claim 1, wherein the quantum dot material layer comprises a third silica mesoporous frame and a quantum dot material housed within the third silica mesoporous frame.

16. The light emitting device according to claim 1, further comprising a glass substrate.

17. The light emitting device according to claim 1, wherein the anode comprises an indium tin oxide semiconductor thin film.

18. A light emitting device according to claim 1, wherein the thermally activated delayed fluorescence material layer is arranged to transfer energy to the quantum dot material layer by means of a fluorescence resonance energy transfer.

19. The light emitting device according to claim 2, wherein an emission spectrum of the thermally activated delayed fluorescence material layer overlaps with an absorption spectrum of the first quantum dot material.

20. A light emitting device comprising:
an anode;
a hole injection layer formed on the anode;
a hole transport layer formed on the hole injection layer;
a light emitting layer formed on the hole transport layer;
an electron transport layer formed on the light emitting layer;
an electron injection layer formed on the electron transport layer; and
a cathode formed on the electron injecting layer,
wherein the light emitting layer comprises N stacked light emitting units, N≥1, and each of the light emitting units comprises:
a thermally activated delayed fluorescence material layer, comprising a thermally activated delayed fluorescence material that emits blue light;
a first quantum dot material layer comprising a quantum dot material emitting yellow light, formed on the thermally activated delayed fluorescence material layer of an associated light emitting unit; and
a second quantum dot material layer, comprising a quantum dot material emitting green light, formed on a side of the thermally activated delayed fluorescence material layer of the associated light emitting unit that faces away from the first quantum dot material layer, an absolute value of a highest occupied molecular orbital energy level of said thermally activated delayed fluorescence material is greater than an absolute value of a valence band top level of the quantum dot material, and an absolute value of a lowest unoccupied molecular orbital energy level of the thermally activated delayed fluorescence material is greater than an absolute value of a conduction band bottom level of the quantum dot material.

* * * * *